US 6,737,689 B1

(12) United States Patent
Schlösser et al.

(10) Patent No.: US 6,737,689 B1
(45) Date of Patent: May 18, 2004

(54) FEMFET DEVICE AND METHOD FOR PRODUCING SAME

(75) Inventors: Till Schlösser, Dresden (DE); Thomas Haneder, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/857,262

(22) PCT Filed: Dec. 1, 1999

(86) PCT No.: PCT/DE99/03817
§ 371 (c)(1),
(2), (4) Date: Jul. 16, 2001

(87) PCT Pub. No.: WO00/35019
PCT Pub. Date: Jun. 15, 2000

(30) Foreign Application Priority Data

Dec. 10, 1998 (DE) .......................... 198 57 038

(51) Int. Cl.[7] .............................................. H01L 29/76
(52) U.S. Cl. ..................... 257/295; 257/310; 257/410; 257/411; 438/3; 438/287; 438/591; 438/775; 438/785
(58) Field of Search .................. 257/295, 310, 257/410, 411, 406; 438/3, 216, 240, 261, 287, 585, 591, 761, 762, 763, 769, 775, 778, 785

(56) References Cited

U.S. PATENT DOCUMENTS

| 3,731,163 | A | | 5/1973 | Shuskus | |
| 4,888,820 | A | * | 12/1989 | Chen et al. | 361/313 |
| 5,596,214 | A | | 1/1997 | Endo | |
| 5,619,051 | A | | 4/1997 | Endo | |
| 5,621,681 | A | * | 4/1997 | Moon | 365/145 |
| 5,955,755 | A | * | 9/1999 | Hirai et al. | 257/295 |
| 6,020,024 | A | * | 2/2000 | Maiti et al. | 427/248.1 |
| 6,069,041 | A | * | 5/2000 | Tanigami et al. | 438/261 |
| 6,084,260 | A | * | 7/2000 | Hirai et al. | 257/295 |
| 6,133,051 | A | * | 10/2000 | Hintermaier et al. | 438/100 |
| 6,140,672 | A | * | 10/2000 | Arita et al. | 257/295 |
| 6,232,242 | B1 | * | 5/2001 | Hata et al. | 427/126.1 |
| 6,236,076 | B1 | * | 5/2001 | Arita et al. | 257/213 |
| 6,255,121 | B1 | * | 7/2001 | Arita et al. | 438/287 |
| 6,278,164 | B1 | * | 8/2001 | Hieda et al. | 257/410 |
| 6,339,238 | B1 | * | 1/2002 | Lim et al. | 257/295 |
| 6,373,743 | B1 | * | 4/2002 | Chen et al. | 365/145 |
| 6,461,982 | B2 | * | 10/2002 | DeBoer et al. | 438/778 |

FOREIGN PATENT DOCUMENTS

| DE | 197 39 673 A | 3/1998 |
| KR | 1999-0084635 | 12/1999 |

* cited by examiner

Primary Examiner—George Eckert
Assistant Examiner—José R. Diaz
(74) Attorney, Agent, or Firm—Welsh & Katz, Ltd.

(57) ABSTRACT

The present invention relates to a FEMFET device with a semiconductor substrate and to at least one field effect transistor that is provided in the semiconductor substrate. The field effect transistor has a source area, a drain area, a channel area and a gate stack. The gate stack has at least one ferroelectric layer and at least one thin diffusion barrier layer being arranged between the lowest ferroelectric layer and the semiconductor substrate and being configured in such a way that an out-diffusion of the components of the ferroelectric layer into the semiconductor substrate is essentially prevented.

6 Claims, 1 Drawing Sheet

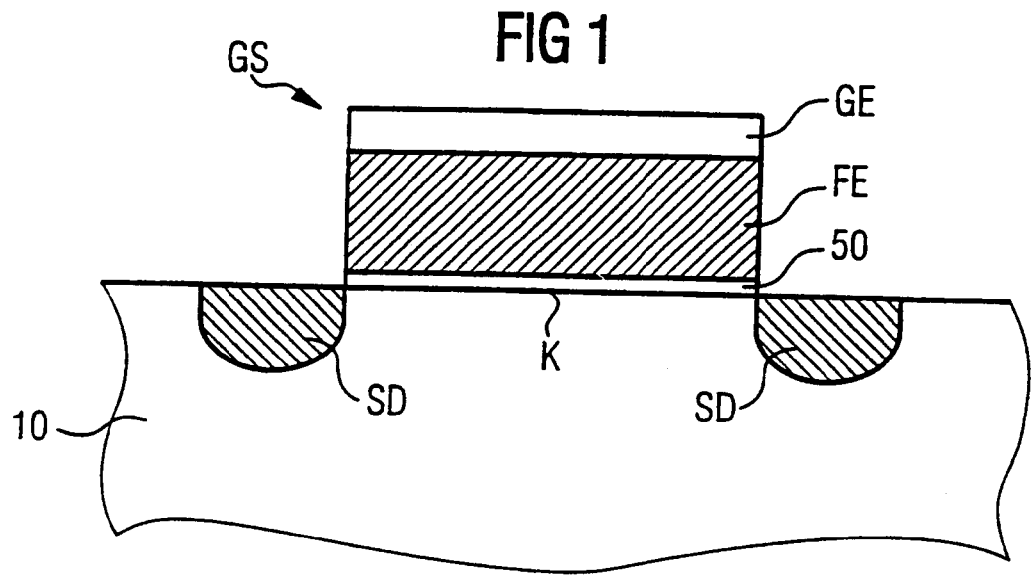
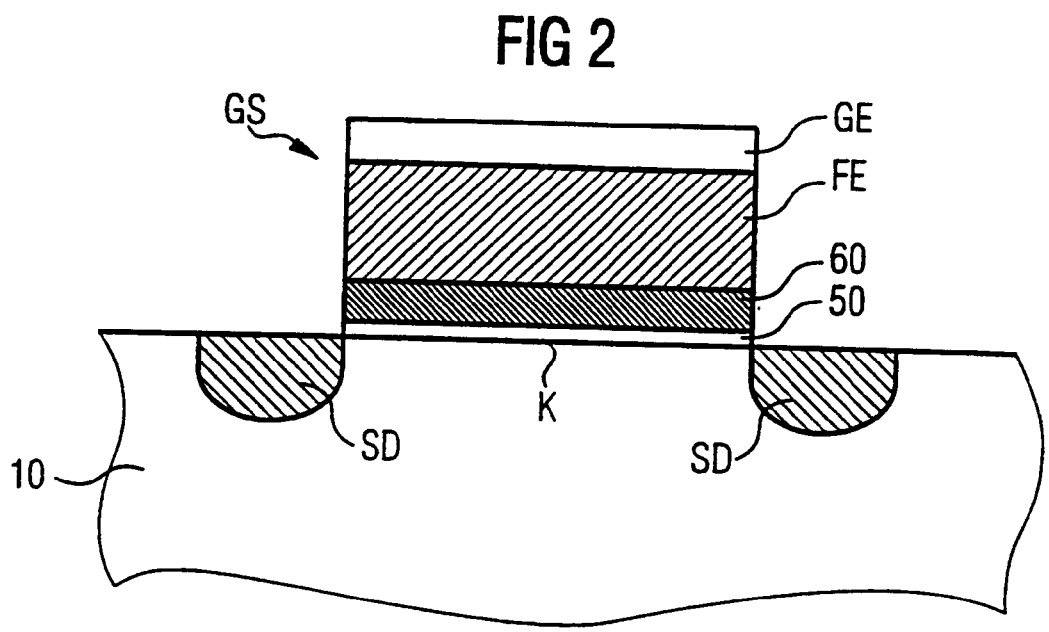

FEMFET DEVICE AND METHOD FOR PRODUCING SAME

The present invention relates to a FEMFET device (FEMFET=ferroelectric memory field-effect transistor) as described in the preamble of claim 1, which is known from EP 0 566 585 B1.

EP 0 566 585 B1 discloses, in general terms, a memory cell arrangement which, as memory cells, has field-effect transistors with a ferroelectric layer (FEMFETs) in the gate dielectric. In that document, it is recommended in particular for the gate dielectric to be designed as a multilayer dielectric, in which a first $SiO_2$ layer is provided on the substrate, above which there is the ferroelectric layer, followed by a second $SiO_2$ layer, to which the gate electrode, for example made from polycrystalline silicon, is applied.

Recently, in the microelectronics sector ferroelectric materials, generally perovskites, have been used to fabricate nonvolatile memory elements. The spontaneous and residual electrical polarization of these materials allows non-volatile storage of charge and therefore information. The ferroelectric materials are usually used either as dielectric layer in a capacitor or in the gate stack of a field-effect transistor.

A field-effect transistor with ferroelectric gate material forms the starting point for the construction of, for example, nonvolatile one-transistor memory cells with extremely short write,erase (unlike EEPROMs) and read times. The residual polarization of the ferroelectric material above the channel of a field-effect transistor and the resultant electric field allow different states, such as inversion or accumulation, to be "stored" in the semiconductor substrate (channel) below. The operating state and the conductivity of the transistor can therefore undergo nonvolatile change through the ferroelectric. The fact that a component of this type can be used to store information and distinguish between logic states is attributable to this property. Information is stored by applying a sufficiently high voltage to the ferroelectric material. As a result, the polarization of the material can be changed (reversed) suitably.

The general problem on which the present invention is based is that of being able to eliminate the need to deposit ferroelectric material immediately above the channel, i.e. directly on the semiconductor substrate, in order to obtain functioning transistors or transistors with good electrical properties.

Poor interfacial properties destroy the function of the component.

Therefore, it has been proposed for one or more additional dielectric layers (what are known as dielectric buffer layers) to be provided between the substrate and the ferroelectric material. On the one hand, they are to ensure a sufficiently good interface with the silicon and therefore good transistor properties, yet on the other hand they are to have the minimum possible effect on the performance of the component.

Ferroelectric materials generally have a very high dielectric susceptibility (high relative dielectric constant $\epsilon_r$ of a few hundred to 1000).

In the ferroelectric field-effect transistor, the semiconductor substrate, the dielectric buffer layer and the ferroelectric form a series circuit of different capacitances. To allow the polarization of the ferroelectric material to be changed using low voltages, it is therefore necessary for the dielectric buffer layer to have the highest possible $\epsilon_r$ and a low layer thickness d, since otherwise most of a voltage which is applied to this combination of layers will drop off across the intermediate layer rather than across the ferroelectric. Otherwise, this leads to high programming voltages and the risk of electrical breakdowns in the layers. In particular, it should be ensured that the formation of natural or process-related $SiO_2$ at the semiconductor substrate/intermediate layer interface is avoided, since $SiO_2$ has an adverse effect on the properties of the transistor, i.e. leads to higher programming voltages, on account of its low $\epsilon_r$ (high voltage drop). To bypass these problems, it has been proposed to use stable oxides with a high dielectric susceptibility, such as for example $CeO_2$, $Y_2O_3$ or $ZrO_2$, as dielectric buffer layer.

The fact that diffusion processes between individual constituents of the ferroelectric material and the semiconductor substrate likewise have a very adverse effect on the transistor properties has proven to be a drawback of the known approaches described above. Although this problem could be counteracted by increasing the layer thickness d of the dielectric buffer layer, this, as has been mentioned, would increase the risk of electrical breakdowns.

Therefore, it is an object of the present invention to improve the FEMFET device defined in the introduction in such a manner that the disruptive diffusion processes are eliminated without having an adverse effect on the electrical properties.

According to the invention, this object is achieved by the FEMFET device described in claim 1 and by the corresponding fabrication process described in claim 6.

Compared to the known solution approaches, the FEMFET device according to the invention has the advantage that there is no longer any disruptive diffusion and, at the same time, the gate stack does not become excessively thick.

The idea on which the present invention is based is for the gate stack to have at least one thin diffusion barrier layer which is arranged between the bottom ferroelectric layer and the semiconductor substrate. Depending on the ferroelectric used, the thin diffusion barrier layer is configured in such a manner that it substantially prevents constituents from diffusing out of the ferroelectric layer or layers into the semi-conductor substrate.

The subclaims provide advantageous refinements and improvements to the FEMFET device described in claim 1.

According to a preferred refinement, the diffusion barrier layer has a silicon nitride layer.

According to a further preferred refinement, the silicon nitride layer is provided directly on the semi-conductor substrate. The usual ferroelectric transistors are exclusively based on the use of ceramic oxides as dielectric intermediate layer. Silicon nitride in combination with prior cleaning of the substrate (removal of the natural oxide), as a new material at this location, offers many advantageous, in particular a good quality of the interface, a sufficiently high relative dielectric constant and, finally, its excellent action as a diffusion barrier even with very small layer thicknesses.

According to a further preferred refinement, at least one dielectric buffer layer is provided in the gate stack between the ferroelectric layer and the semi-conductor substrate. In this way, it is possible to increase the capacitance of the gate stack combined with simultaneous resistance to diffusion.

According to a further preferred refinement, the dielectric buffer layer is provided directly on the semiconductor substrate. This is expedient if the dielectric buffer layer and the semiconductor substrate have good interfacial properties.

Exemplary embodiments of the invention are illustrated in the drawings and explained in more detail in the following description. In the drawings:

FIG. 1 shows a diagrammatic illustration of a FEMFET device according to a first embodiment of the present invention; and FIG. 2 shows a diagrammatic illustration of a FEMFET device according to a second embodiment of the present invention.

In the figures, identical reference numerals denote identical elements or elements of an identical function.

FIG. 1 diagrammatically depicts a FEMFET device according to a first embodiment of the present invention.

In FIG. 1, 10 denotes a semiconductor substrate, S denotes a source region, D denotes a drain region, K denotes a channel region, GS denotes a gate stack, 50 denotes a diffusion barrier layer, FD denotes a ferro-electric layer and GE denotes a gate electrode.

In the context of this first embodiment, a combination of high-purity interface and silicon nitride ($Si_3N_4$) is proposed as diffusion barrier layer. In modern cluster tools, the removal of the natural oxide ($SiO_2$) which is present on the semiconductor substrate 10 using hydrofluoric acid vapor on the substrate surface can be immediately followed by the deposition of $Si_3N_4$, without the semiconductor substrate 10 being exposed to an oxidizing atmosphere between the two steps. As a result, it is possible for $Si_3N_4$ to be deposited directly on the semiconductor substrate 10, without having to accept the formation of oxide, in particular $SiO_2$, as may be the case when using ceramic oxides ($CeO_2$, $Y_2O_3$ or $ZrO_2$).

Compared to $SiO_2$, $Si_3N_4$ has an $\epsilon_r$ which is greater by a factor of 2, being approximately 7.9. Therefore, given otherwise identical conditions, the programming voltage of the transistor compared to the use of $SiO_2$ as intermediate layer is reduced by a factor of 2. At the same time, the quality of the Si—$Si_3N_4$ interface is better than that of the interface between silicon and a ceramic oxide. Furthermore, $Si_3N_4$ presents an extremely good diffusion barrier between the semiconductor substrate 10 and the ferroelectric material FE and is scarcely oxidized during application of this material. Therefore, the silicon/diffusion barrier layer interface is not affected by diffusing components of the ferroelectric material. To achieve very low programming voltages, it is possible for the silicon nitride to be made very thin (a few nm).

The fabrication of a ferroelectric transistor of this type as shown in FIG. 1 with silicon nitride as a diffusion barrier layer otherwise takes place in a very similar way to the fabrication of conventional MOSFETs. Active and inactive regions on the semiconductor substrate are defined, for example, by the LOCOS technique. After implantation of the wells, the exposed silicon surface is cleaned using HF vapor or $N_2O$ vapor, for example in a cluster tool. Then, for example using an RTN process and/or using a CVD process, compact silicon nitride ($Si_3N_4$) is thermally deposited in the desired thickness on the cleaned surface, without the substrate being exposed to an oxidizing atmosphere between these steps. Then, the ferroelectric material, for example strontium bismuth tantalate (SBT) or lead zirconium titanate (PZT), is deposited, for example using a single-stage or multistage sol gel process or using a CVD process, and is then converted to the desired ferroelectric phase by subsequent heat treatment steps. After structuring of the material, source and drain are implanted and electrical contact is made using a suitable electrode material.

At the same time, this electrode material is also used to make large-area electrical contact with the ferro-electric material, so that connections for source, drain and gate are formed.

FIG. 2 diagrammatically depicts a FEMFET device according to a second embodiment of the present invention.

In FIG. 2, in addition to the reference numerals which have already been introduced, 60 denotes a dielectric buffer layer.

In this second embodiment, a dielectric buffer layer 60 is applied to the diffusion barrier layer 50. This has the advantage that the layer beneath the ferroelectric FE can be made thicker yet the good properties of silicon nitride, in particular including its electrical behavior, is improved further or at least is not impaired as a result of different capacitances being connected in series.

A thicker layer of the same capacitance allows the voltage which drops off across this layer to be kept constant and therefore allows the field strength to which this layer is exposed to be reduced.

This has a positive effect on the reliability and electrical breakthrough behavior. This is possible because an oxide, such as for example $CeO_2$, has a relative dielectric constant $\epsilon_r$=20–25 which is 2.5 times greater than that of silicon nitride and therefore can be of thicker design while achieving the same effective capacitance.

Although the present invention has been described above on the basis of preferred exemplary embodiments, it is not restricted thereto, but rather can be modified in numerous ways.

For example, it is possible to reverse the order of the dielectric buffer layer and the diffusion barrier layer in such a manner that the dielectric buffer layer is applied to the substrate, with the diffusion barrier layer above it.

It is also possible to select a sandwich structure with alternating dielectric buffer layers and diffusion barrier layers.

Also, the term semiconductor substrate is to be understood in the general sense and may refer to both monocrystalline wafer substrates and also well substrates, epitaxial substrates, etc.

All processes which are suitable for the removal of the natural oxide can be used to clean the substrate.

What is claimed is:

1. A FEMFET device having:

a substrate;

at least one field-effect transistor in the substrate, said field-effect transistor having a source region, a drain region, channel region and a gate stack;

the gate stack having a ferroelectric layer and an adjacent dielectric buffer layer; and a thin diffusion barrier layer between the ferroelectric layer and the substrate, said gate stack capable of substantially preventing constituents from diffusing out of the ferroelectric layer into the substrate;

the dielectric buffer layer being between the ferroelectric layer and the substrate; and the diffusion barrier layer comprising a silicon nitride layer with a thickness in the range of a few nanometers;

wherein the dielectric buffer layer comprises a ceramic oxide layer with a dielectric constant in the range from 20–25; and the dielectric buffer layer is thicker than the diffusion barrier layer and has the same capacitance as the diffusion barrier layer.

2. The FEMFET device as claimed in claim 1, wherein the silicon nitride layer is provided directly on the substrate.

3. The FEMFET device as claimed in claim 1, wherein the dielectric buffer layer is provided directly on the substrate.

4. The FEMFET device as claimed in claim 1, wherein a sandwich structure with alternating dielectric buffer layers and diffusion barrier layers is provided.

5. The FEMFET device as claimed in claim 1, wherein the ceramic oxide layer is made from $CeO_2$.

6. A process for fabricating the FEMFET device as claimed in claim 1, wherein a natural oxide which is present on the substrate is removed in an etching process, and the silicon nitride layer is then deposited in situ, without exposing the substrate to an oxidizing atmosphere between these steps.

\* \* \* \* \*